(12) United States Patent
Chen et al.

(10) Patent No.: US 12,396,141 B2
(45) Date of Patent: Aug. 19, 2025

(54) COOLING DEVICE AND COOLING METHOD APPLIED TO RACK SERVER

(71) Applicant: Super Micro Computer, Inc., San Jose, CA (US)

(72) Inventors: Chia-Wei Chen, New Taipei (TW); Kun-Chieh Liao, New Taipei (TW); Yueh-Ming Liu, New Taipei (TW)

(73) Assignee: Super Micro Computer, Inc., San Jose, CA (US)

( * ) Notice: Subject to any disclaimer, the term of this patent is extended or adjusted under 35 U.S.C. 154(b) by 249 days.

(21) Appl. No.: 18/176,291

(22) Filed: Feb. 28, 2023

(65) Prior Publication Data

US 2024/0147673 A1 May 2, 2024

(30) Foreign Application Priority Data

Oct. 28, 2022 (TW) ................... 111141211

(51) Int. Cl.
*H05K 7/20* (2006.01)

(52) U.S. Cl.
CPC ..... *H05K 7/20836* (2013.01); *H05K 7/20272* (2013.01); *H05K 7/20281* (2013.01); *H05K 7/20763* (2013.01)

(58) Field of Classification Search
None
See application file for complete search history.

(56) References Cited

U.S. PATENT DOCUMENTS

| 11,974,416 B2 * | 4/2024 | Heydari | H05K 7/20827 |
| 2001/0020365 A1 * | 9/2001 | Kubo | H05K 7/20309 |
| | | | 257/E23.099 |
| 2006/0272342 A1 * | 12/2006 | Bash | F24F 11/30 |
| | | | 62/199 |
| 2019/0141861 A1 * | 5/2019 | Shedd | H05K 7/20836 |
| 2020/0166246 A1 * | 5/2020 | Eadelson | F25B 23/006 |
| 2020/0400366 A1 * | 12/2020 | Trnka | F25D 21/006 |

* cited by examiner

*Primary Examiner* — Courtney L Smith
(74) *Attorney, Agent, or Firm* — Beyer Law Group LLP (57) ABSTRACT

A cooling device for rack servers and cooling method for rack servers are provided. The cooling device for rack servers includes an environmental temperature sensor, a humidity sensor, a coolant temperature sensor, an electronic valve, and a controller. The controller is configured to compute a dew point temperature according to an ambient temperature and an ambient humidity sensed by the environmental temperature sensor and the humidity sensor, compute a temperature difference between a outlet-liquid temperature of a coolant and the dew point temperature, and control an opening of the electronic valve according to the temperature difference to adjust a liquid flow of the coolant outputted, such that the outlet-liquid temperature dynamically changes following the adjustment of the liquid flow.

7 Claims, 5 Drawing Sheets

COOLING DEVICE AND COOLING METHOD APPLIED TO RACK SERVER

CROSS-REFERENCE TO RELATED APPLICATION

This application claims benefit of Taiwanese Patent Application No. 111141211 filed on Oct. 28, 2022. The entire contents of each application noted above are hereby incorporated by reference.

BACKGROUND OF THE DISCLOSURE

Technical Field

The disclosure generally relates to a cooling device and a cooling method, and more particularly to a cooling device and a cooling method for a rack server.

Description of Related Art

The design of the cooling system of the rack server of the related art is to dispose the conduits inside each server of each rack and convey the coolant to the conduit inside the server to take away the heat generated by the server in order to cool the server. Nonetheless, when the environmental temperature or the environment humidity is high and the temperature of the coolant inside the conduit is low, the water vapor in the environment will condense into the dew to attach on the conduits inside the server. When the dew on the conduit drips on the server, the dew causes damage to the electrical component of the server.

Accordingly, how to prevent the dew from causing damage to the electrical component while the cooling system is operated is the technical problem to be solved in the present disclosure.

SUMMARY OF THE DISCLOSURE

The disclosure can be more fully understood by reading the following detailed description of the embodiments, with reference made to the accompanying drawings as described below. It should be noted that the features in the drawings are not necessarily to scale. In fact, the dimensions of the features may be arbitrarily increased or decreased for clarity of discussion.

The present disclosure of an embodiment provides a cooling device for rack servers including an environmental temperature sensor, a humidity sensor, a coolant temperature sensor, an electronic valve, and a controller. The environmental temperature sensor is configured to sense an ambient temperature. The humidity sensor is configured to sense an ambient humidity. The coolant temperature sensor is disposed on an output conduit outputting a coolant and configured to sense an outlet-liquid temperature of the coolant outputted from the output conduit. The electronic valve is disposed on the output conduit. The controller is connected with the environmental temperature sensor, the humidity sensor, the coolant temperature sensor, and the electronic valve. The electronic valve is configured to compute a dew point temperature according to the ambient temperature and the ambient humidity, compute a temperature difference between the outlet-liquid temperature and the dew point temperature, and control an opening of the electronic valve according to the temperature difference to adjust a liquid flow of the coolant outputted, such that the outlet-liquid temperature dynamically changes according to the liquid flow.

The present disclosure of an embodiment provides a cooling method for rack servers including steps of sensing an ambient temperature by an environmental temperature sensor; sensing an ambient humidity by a humidity sensor; sensing, by a coolant temperature sensor, an outlet-liquid temperature of the coolant outputted from an output conduit; computing, by a controller, a dew point temperature according to the ambient temperature and the ambient humidity; and computing, by the controller, a temperature difference between the outlet-liquid temperature and the dew point temperature and controlling an opening of the electronic valve disposed on the output conduit to adjust a liquid flow of the coolant outputted according to the temperature difference, such that the outlet-liquid temperature dynamically changes according to the liquid flow.

It is to be understood that both the foregoing general description and the following detailed description are by examples, and are intended to provide further explanation of the disclosure as claimed.

BRIEF DESCRIPTION OF THE DRAWINGS

The disclosure can be more fully understood by reading the following detailed description of the embodiments, with reference made to the accompanying drawings as described below. It should be noted that the features in the drawings are not necessarily to scale. In fact, the dimensions of the features may be arbitrarily increased or decreased for clarity of discussion.

DETAILED DESCRIPTION

The technical terms "first", "second" and the similar terms are used to describe elements for distinguishing the same or similar elements or operations and are not intended to limit the technical elements and the order of the operations in the present disclosure. Furthermore, the element symbols/alphabets can be used repeatedly in each embodiment of the present disclosure. The same and similar technical terms can be represented by the same or similar symbol s/alphabets in each embodiment. The repeated symbol s/alphabets are provided for simplicity and clarity and they should not be interpreted to limit the relation of the technical terms among the embodiments.

Reference will now be made in detail to the present embodiments of the disclosure, examples of which are illustrated in the accompanying drawings. Wherever possible, the same reference numbers are used in the drawings and the description to refer to the same or like parts.

Generally, a plurality of rack servers is disposed in the server room. The heat generated while the rack servers operate makes an ambient temperature of the server room increasing. To prevent the electronic components of the rack server from being damaged because of the high temperature of the rack server, it is necessary to provide an architecture and a mechanism for cooling the rack server.

Figure 1:
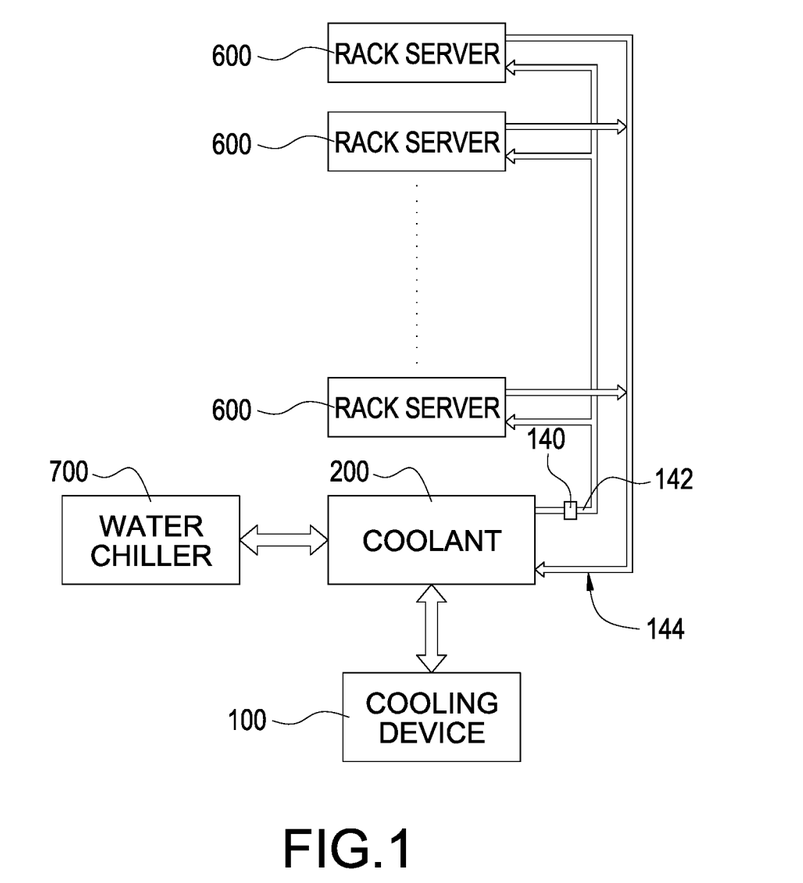
FIG. 1 illustrates an example environment architecture of the cooling device applied for the rack server according to one embodiment of the present disclosure.

Reference is made to FIG. 1. FIG. 1 illustrates an example environment architecture of the cooling device applied for the rack server according to one embodiment of the present disclosure. As shown in FIG. 1, a cooling device 100 controls a liquid flow of a coolant 200 outputted from an output conduit 142, such that the coolant 200 is outputted to a conduit inside each rack server 600 for a heat exchange. The temperature of the coolant 200 increases correspondingly while the heat exchange, and then the coolant 200 is conveyed back to a liquid storage tank (not shown in figures) through an input conduit 144. The temperature of the coolant 200 is then decreased through the heat exchange by using cold liquid outputted by a water chiller 700. The cooling coolant 200 is outputted to the conduit inside each rack server 600 for a heat exchange again.

In one embodiment, the cooling device 100 is the cooling distribution unit (CDU).

In one embodiment, an electronic valve 140 is disposed on the output conduit 142. The electronic valve 140 includes an opening and is configured to adjust an output amount of the liquid flow of the coolant 200. If the opening of the electronic valve 140 is large, the output amount of the liquid flow of the coolant 200 is large correspondingly. In contrast, if the opening of electronic valve 140 is small, the output amount of the liquid flow of the coolant 200 is small correspondingly.

In one embodiment, the opening of the electronic valve 140 is controlled by a step motor.

Figure 2:
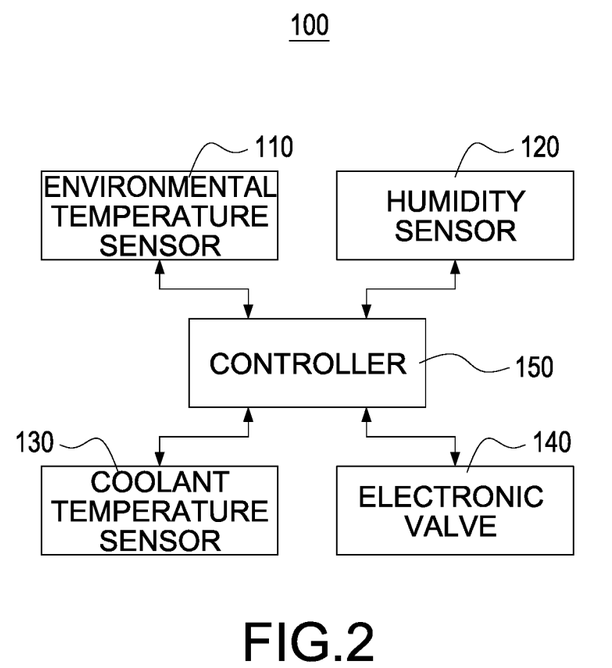
FIG. 2 is a block diagram illustrating an example cooling device according to one embodiment of the present disclosure.

Reference is made to FIG. 2. FIG. 2 is a block diagram illustrating an example cooling device according to one embodiment of the present disclosure. As shown in FIG. 2, the cooling device 100 includes an environmental temperature sensor 110, a humidity sensor 120, a coolant temperature sensor 130, the electronic valve 140, and a controller 150. The controller 150 is electrically or communicatively connected with the environmental temperature sensor 110, the humidity sensor 120, the coolant temperature sensor 130, and the electronic valve 140.

In one embodiment, the environmental temperature sensor 110 is configured to sense an ambient temperature, such as the air temperature in the server room, the temperature of the output conduit 142, or the temperature of the rack server 600, and it is not limited herein.

In one embodiment, the humidity sensor 120 is configured to sense the ambient humidity, such as the air humidity of the server room or the humidity of the rack server 600, and it is not limited herein.

In one embodiment, the environmental temperature sensor 110 and the humidity sensor 120 are disposed on the position that is adjacent to the cooling device 100.

It should be noted that the ambient temperature and the ambient humidity in the server room are different from the positions (e.g., the ambient temperature/the ambient humidity of the position near the cooling device 100 may be different from that of the position near the rack server 600) though, because the sensing data is acquired in the same semi-closed environment by the environmental temperature sensor 110 and the humidity sensor 120, the data difference (such as the temperature difference or the humidity difference) among the sensing data acquired by the sensors that are disposed on different positions in the semi-closed environment does not affect the accuracy and the cooling mechanism works effectively under the data difference in the present disclosure.

In one embodiment, the environmental temperature sensor 110 and the humidity sensor 120 are disposed at the position adjacent to the cooling device 100 by a user, such that the user may manage the environmental temperature sensor 110 and the humidity sensor 120 for convenience (e.g., for the breakdown maintenance or for upgrading hardware). At the same time, the disturbance to the owner of the rack server 600 can also be prevented because the environmental temperature sensor 110 and the humidity sensor 120 are not disposed inside or adjacent to the rack server 600.

In one embodiment, the coolant temperature sensor 130 is disposed on an outlet of the output conduit 142 to sense the outlet-liquid temperature of the coolant 200 outputted from the output conduit 142.

In one embodiment, the controller 150 controls the opening of the electronic valve 140 to adjust the output amount of the liquid flow of the coolant 200. The opening (or opening scale) indicates the opening level that the mechanism of the electronic valve 140 works normally.

In one embodiment, the controller 150 may be but is not limited to the central processing unit (CPU), the system on chip (SoC), the programmable logic controller (PLC), the field programmable gate array (FPGA), the microcontroller, or the microprocessor.

To prevent water vapor in the environment from condensing into the dew to attach on the conduit inside the rack server 600 or to prevent the dew on the conduit from dripping onto the electronic component of the rack server 600, resulting in damage because the electronic component of the rack server 600 exposes to the dew, the controller collects all the sensing data discussed above for computing the condensing status and controls the liquid flow of the coolant 200 to dynamically adjust the liquid temperature of the coolant 200 being delivered. Therefore, the dew in the environment will not condense on the conduit inside the rack server 600 when the coolant 200 cools the rack server 600.

In one embodiment, the controller 150 computes a dew point temperature according to the ambient temperature and the ambient humidity. The dew point temperature indicates the air temperature being cooled at a constant vapor pressure to achieve a saturated liquid form.

In one embodiment, the controller 150 reads a lookup table that stores the dew point temperature corresponding to the ambient temperature (such as the Celsius temperature or the Fahrenheit temperature) and the ambient humidity (such as the relative humidity %). The controller 150 searches the lookup table according to the ambient temperature and the ambient humidity to obtain the corresponding dew point temperature. In the present disclosure, the Celsius temperature is taken as an example for illustration.

In one embodiment, the controller 150 computes a temperature difference between the outlet-liquid temperature that the coolant 200 is outputted from output conduit 142 and the dew point temperature. The temperature difference is, for example, the difference value of the dew point temperature subtracted from the outlet-liquid temperature. The controller 150 controls the opening of the electronic valve 140 based on the temperature difference.

When the temperature difference is large, the probability that the dew condenses on the conduit inside the rack server 600 is low. In this situation, the cooling device 100 allows the electronic valve 140 to output more coolant 200 for the heat exchange (because the efficiency of heat exchange is good for the large temperature difference). When the temperature difference is small, the probability that the dew condenses on the conduit inside the rack server 600 is high. In this situation, the cooling device 100 only allows the electronic valve 140 to output less coolant 200 to prevent the dew from condensing on the output conduit 142 because the temperature of the conduit inside the rack server 600 keeps decreasing.

The coolant temperature sensor 130 is disposed on the outlet of the output conduit 142 to obtain the outlet-liquid temperature. It should be noted that the difference between the temperature of the coolant 200 sensed at the outlet of the output conduit 142 and the temperature of the coolant 200 sensed at the conduit inside the rack server 600 is small; therefore, the present disclosure takes the outlet-liquid temperature sensed at the outlet of the output conduit 142 as the temperature of the coolant 200 of the conduit inside the rack server 600.

In one embodiment, the controller 150 decreases the opening of the electronic valve 140 to a first value (e.g., 50% of an upper limit) to decrease the liquid flow of the coolant 200 outputted when determining that the temperature difference is less than a first threshold (e.g., 5 degrees).

In one embodiment, the controller 150 keeps decreasing the opening of the electronic valve 140 to a second value (e.g., 20% of the upper limit) to decrease the liquid flow of the coolant 200 outputted when determining that the temperature difference is less than a second threshold (e.g., 2 degrees).

In one embodiment, the second threshold is less than the first threshold and the second value is less than the first value.

In one embodiment, the controller 150 increases the opening of the electronic valve 140 to a third value (e.g., 50% of the upper limit) to increase the liquid flow of the coolant 200 outputted when determining that the temperature difference is not less than the third threshold (e.g., 4 degrees).

In one embodiment, the controller 150 increases the opening of the electronic valve 140 to a fourth value (e.g., 100% of the upper limit) to increase the liquid flow of the coolant 200 outputted when determining that the temperature difference is not less than the fourth threshold (e.g., 7 degrees).

In one embodiment, the fourth threshold is greater than the third threshold and the fourth value is greater than the third value.

Figure 3:
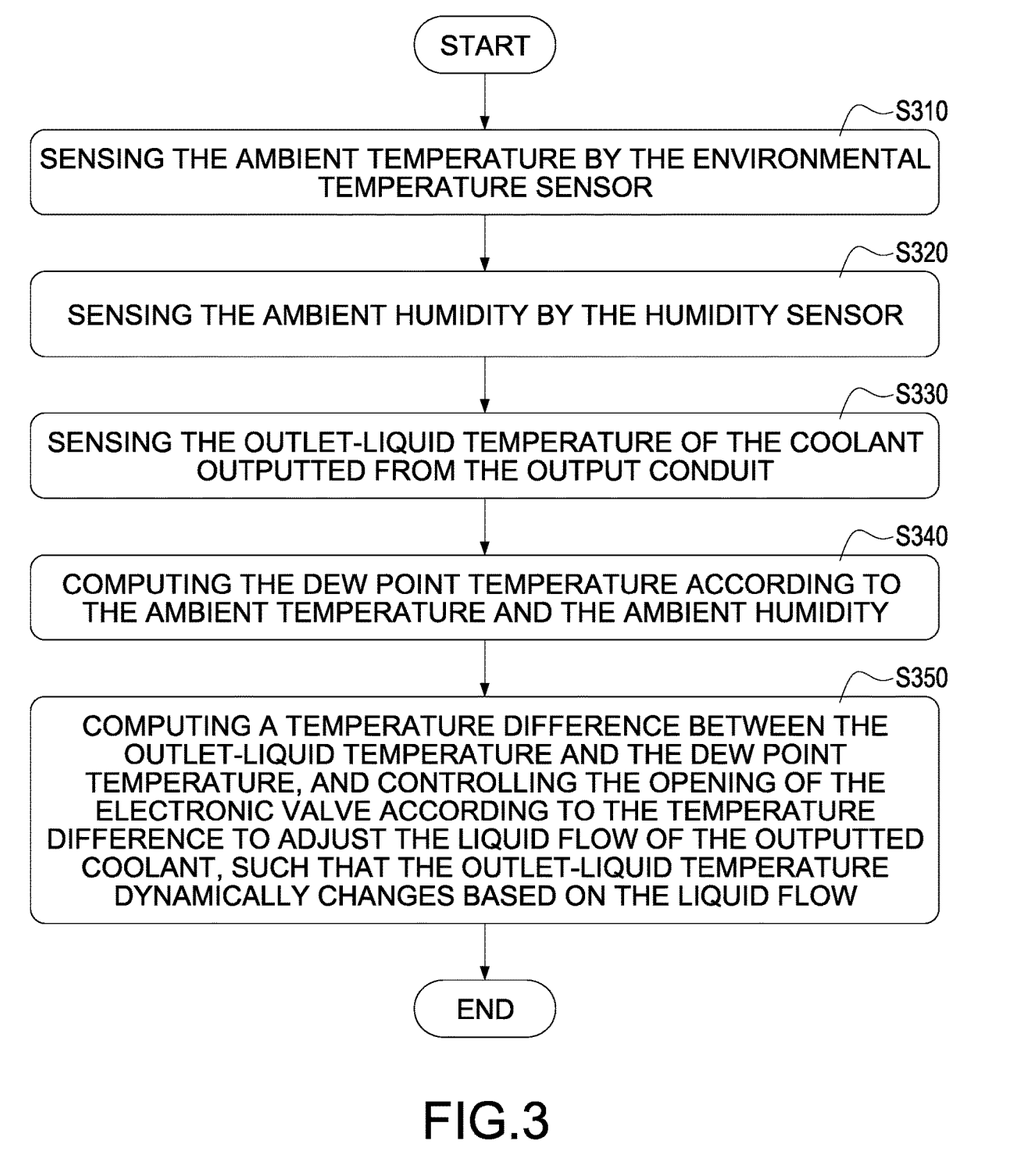
FIG. 3 illustrates a flowchart of a cooling method applied for the rack server according to one embodiment of the present disclosure.

Reference is made to FIG. 3. FIG. 3 illustrates a flowchart of a cooling method applied for the rack server according to one embodiment of the present disclosure. The cooling method of FIG. 3 is performed by the cooling device 100 of FIG. 2. The following description of FIG. 3 is incorporated with FIG. 2.

In step S310, the environmental temperature sensor 110 senses the ambient temperature. In one embodiment, the ambient temperature is the air temperature in the server room.

In step S320, the humidity sensor 120 senses the ambient humidity. In one embodiment, the ambient humidity is the air humidity in the server room.

In step S330, the coolant temperature sensor 130 senses the outlet-liquid temperature of the coolant 200 outputted from the output conduit 142.

In step S340, the controller 150 computes the dew point temperature according to the ambient temperature and the ambient humidity.

In one embodiment, the controller 150 searches the lookup table for the dew point temperature. The lookup table is shown as TABLE 1. The lookup table records the dew point temperature corresponding to the ambient temperature and the ambient humidity. It should be noted that the content of the lookup table, TABLE 1, is shown as one example, and it is not limited to the content of TABLE 1.

TABLE 1

| the dew point temperature lookup table | | |
|---|---|---|
| ambient | ambient humidity | |
| temperature | 55% | 60% |
| 12° C. | 3.2° C. | 4.5° C. |
| 14° C. | 5.1° C. | 6.4° C. |

In step S350, the controller 150 computes the temperature difference between the outlet-liquid temperature and the dew point temperature and controls the opening of the electronic valve 140 disposed on the output conduit 142 according to the temperature difference to adjust the liquid flow of the coolant 200 outputted, such that the outlet-liquid temperature of the coolant 200 is dynamically changed as a result following the adjustment of the liquid flow of the coolant 200.

For example, when the ambient temperature is 12° C. and the ambient humidity is 60%, the controller 150 obtains the dew point temperature, 4.5° C., from the lookup table (e.g., TABLE 1). If the outlet-liquid temperature sensed by the coolant temperature sensor 130 is 9° C. at that time, the controller 150 computes the temperature difference of the outlet-liquid temperature and the dew point temperature as 4.5° C.

For another example, when the ambient temperature is 14° C. and the ambient humidity is 55%, the controller 150 obtains the dew point temperature, 5.1° C., from the lookup table (e.g., TABLE 1). If the outlet-liquid temperature sensed by the coolant temperature sensor 130 is 11° C. at that time, the controller 150 computes the temperature difference between the outlet-liquid temperature and the dew point temperature as 5.9° C.

In one embodiment, the coolant temperature sensor 130 senses the outlet-liquid temperature and provides the outlet-liquid temperature to the controller 150 such that the liquid flow of the coolant 200 is adjusted.

Figure 4:
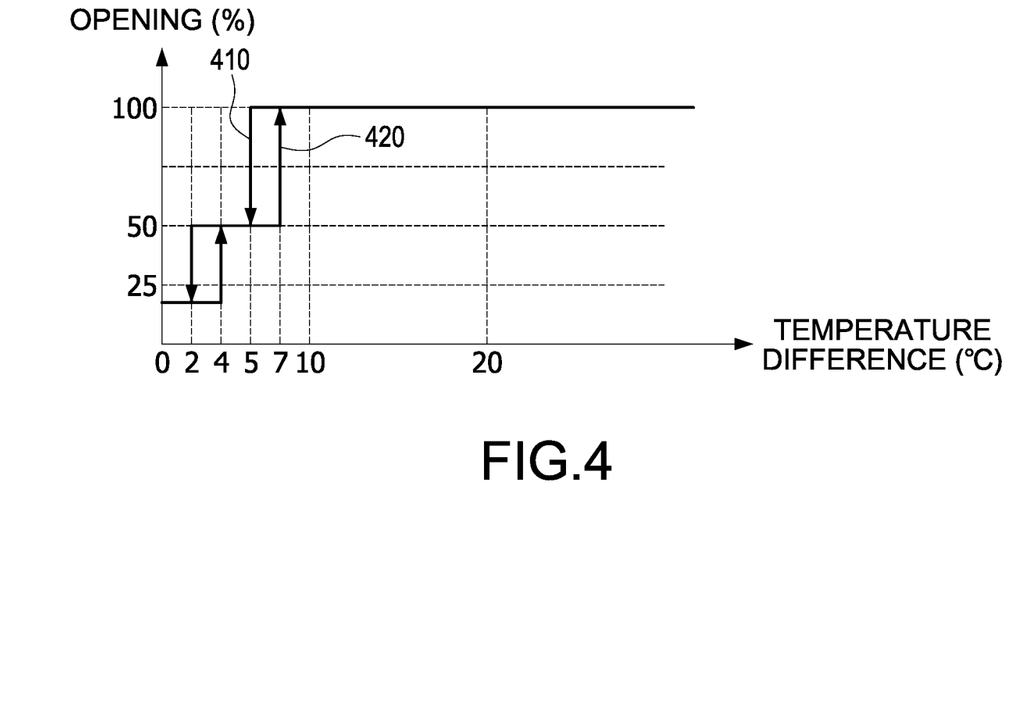
FIG. 4 illustrates an example opening controlling curve according to one embodiment of the present disclosure.

In one embodiment, the controller 150 controls the opening of the electronic valve 140 according to the temperature difference. The control process of the opening of the electronic valve 140 is described and incorporated with FIG. 4. FIG. 4 illustrates an example opening controlling curve according to one embodiment of the present disclosure.

In the embodiment of FIG. 4, the controller 150 controls the opening of the electronic valve 140 according to an opening controlling curve 410 and an opening controlling curve 420. As shown in FIG. 4, the X-axis of the opening controlling curves 410 and 420 indicates the temperature difference, and the Y-axis indicates the opening of the electronic valve 140. The opening is based on a maximum opening level that the electronic valve 140 normally operates (except the malfunction), and the percentage (%) represents the opening level of the electronic valve 140. For example, the opening 100% represents the maximum opening level of the electronic valve 140. The opening 50% represents half of the maximum opening level of the electronic valve 140. The opening 0% represents that the electronic valve 140 is completely closed. In one embodiment, the electronic valve 140 will not be completely closed in the present disclosure.

In one embodiment, the opening controlling curve 410 corresponds to the control strategy for the temperature difference decreasing.

In one embodiment, when the temperature difference decreases from greater than 5 degrees (e.g., 55 degrees) to between 0 degree and 5 degrees (e.g., 3 degrees) (and the maximum opening level of the opening is 100% at this time), the controller 150 switches the opening of the electronic valve 140, from the maximum opening level 100% to the opening 50%, to decrease the liquid flow of the coolant 200 outputted.

In one embodiment, when the temperature difference decreases from less than 5 degrees (e.g., 3 degrees) to less than 2 degrees (e.g., 1 degree) (and the opening is 50% at this time), the controller 150 switches the opening of the electronic valve 140, from the opening 50% to the opening 20%, to decrease the liquid flow of the coolant 200 outputted. In the embodiment, the opening 20% is the smallest opening level of the electronic valve 140.

In one embodiment, the opening controlling curve 420 corresponds to the control strategy for the temperature difference increasing.

In one embodiment, when the temperature difference increases from less than 4 degrees (e.g., 3 degrees) to between 4 degrees and 7 degrees (e.g., 5 degrees) (and the opening is 20% at this time), the controller 150 switches the opening of the electronic valve 140, from the opening 20% to the opening 50%, to increase the liquid flow of the coolant 200 outputted.

In one embodiment, when the temperature difference increases from between 4 degrees and 7 degrees (e.g., 5 degrees) to greater than 7 degrees (e.g., 15 degrees), the controller 150 switches the opening of the electronic valve 140, from the opening 50% to the opening 100%, to increase the liquid flow of the coolant 200 outputted.

In the present disclosure, the controller 150 monitors the ambient temperature and the ambient humidity to obtain the dew point temperature and adjusts the outlet-liquid temperature based on the dew point temperature. Because the outlet-liquid temperature affects the probability that the dew condenses on the conduits, the controller 150 controls the opening of the electronic valve 140 by using the temperature difference between the outlet-liquid temperature and the dew point temperature to dynamically adjust the outlet-liquid temperature of the coolant in order to solve the problem that the dew condenses in the environment.

Figure 5:
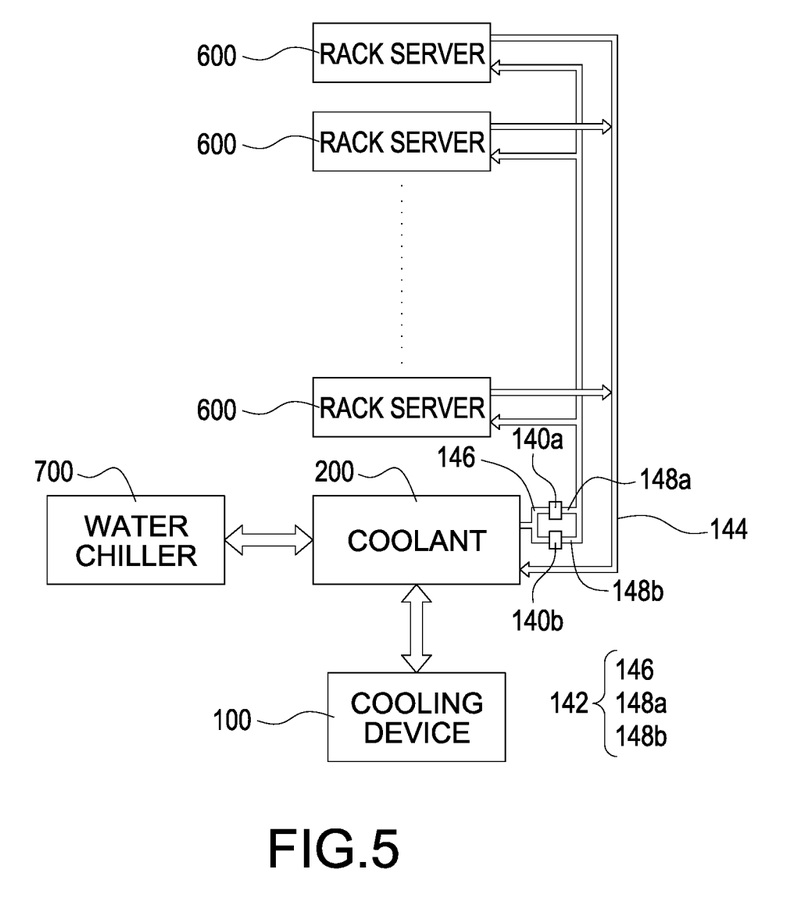
FIG. 5 illustrates an example environment architecture of the cooling device applied for the rack server according to another embodiment of the present disclosure.

Reference is made to FIG. 5. FIG. 5 illustrates an example environment architecture of the cooling device applied for the rack server according to another embodiment of the present disclosure. Compared with FIG. 1, the output conduit 142 in FIG. 5 includes a main conduit 146, a branch conduit 148*a* (first branch conduit), and a branch conduit 148*b* (second branch conduit). An electronic valve 140*a* is disposed on the branch conduit 148*a*. An electronic valve 140*b* is disposed on the branch conduit 148*b*. The main conduit 146 is respectively connected with the branch conduit 148*a* and the branch conduit 148*b*, so the coolant 200 is selectively (controlled by the controller 150) outputted to the rack server 600 either through the branch conduit 148*a* or through the branch conduit 148*b*.

In one embodiment, the coolant temperature sensor 130 is disposed on the main conduit 146 to obtain the outlet-liquid temperature of the coolant 200 outputted.

In one embodiment, the controller 150 executes the cooling method of FIG. 3 to respectively control the opening of the electronic valve 140*a* and the opening of the electronic valve 140*b* to perform the heat exchange of the rack server 600.

In one embodiment, the controller 150 switches on one of the electronic valves 140*a* and the electronic valve 140*b* to connect the branch conduit 148*a* or the branch conduit 148*b*, such that the coolant 200 is outputted to each rack server 600 for the heat exchange either through the main conduit 146 and the branch conduit 148*a* or through the main conduit 146 and the branch conduit 148*b*.

In one embodiment, the controller 150 executes the cooling method of FIG. 3 to selectively control the opening of the electronic valve 140*a* or the opening of the electronic valve 140*b* in order to achieve the dynamic adjustment of the outlet-liquid temperature of the coolant 200 and prevent the water vapor from condensing into the dew.

In one embodiment, the controller 150 controls one of the electronic valve 140*a* and the electronic valve 140*b* to perform the cooling method in FIG. 3. When the failure of one of the electronic valve 140*a* and the electronic valve 140*b* occurs, the controller 150 switches on another electronic valve (which works normally) to conduct the corresponding branch conduit, such that the coolant 200 is provided to the conduit inside the rack server 600. For example, if the failure of the electronic valve 140*a* occurs, the coolant 200 cannot be conveyed through the branch conduit 148*a*. At this time, the controller 150 switches on the electronic valve 140*b* to conduct the branch conduit 148*b*, so the coolant 200 can be outputted through the main conduit 146 and the branch conduit 148*b* to the conduit inside each rack server 600. Accordingly, the design of a plurality of the electronic valves and the branch conduits may solve the problem that the rack server 600 cannot be cooled (and may be crashed without being cooled) when the electronic valve fails. That is, when one electronic valve fails, another electronic valve works for maintaining the cooling function. At the same time, the design of the plurality of the electronic valves may achieve dynamic adjustment of the outlet-liquid temperature and prevent the water vapor from condensing into the dew.

In another embodiment, the controller 150 executes the cooling method of FIG. 3 to control the opening of the electronic valve 140*a* and the electronic valve 140*b* at the same time, such that the total level of the opening of the electronic valve 140*a* and the opening of the electronic valve 140*b* may effectively perform the heat exchange of the rack server 600 and prevent the dew from condensing on the conduits inside the rack server 600.

For example, if an abnormality of the electronic valve 140*a* occurs and the opening of the electronic valve 140*a* in unable to satisfy the requirement of the controller 150 (e.g., the opening should be 100%, but the actual opening is 50% and a remaining 50% cannot be met the requirement). In response to the failure, the controller 150 switches on the electronic valve 140*b* to conduct the branch conduit 148*b*, such that the opening of the electronic valve 140*b* (e.g., 50%) compensates for the opening that the electronic valve 140*a* cannot provide. Therefore, the total level of the opening of the electronic valve 140*a* and the opening of the electronic valve 140*b* ensures the expected liquid flow. Accordingly, the design of the plurality of the electronic valves and the branch conduit may immediately compensate for the opening when the abnormality of one electronic valve occurs and solve the problem that the rack server 600 cannot be cooled (and may be crashed without being cooled). At the same time, the design of the plurality of the electronic valves may achieve dynamic adjustment of the outlet-liquid temperature and prevent the water vapor from condensing into the dew.

As described above, the cooling device and the cooling method for the rack servers of the present disclosure may dynamically adjust the conveyance level (relative to the opening) to effectively prevent the water vapor in the environment from condensing into the dew on the conduits inside the rack server. Accordingly, the condensation is avoided and the damage because of the dew, generated by the condensation and dripping on the electronic components, is also avoided to increase the safety of the server racks.

It will be apparent to those skilled in the art that various modifications and variations can be made to the structure of the present disclosure without departing from the scope or spirit of the disclosure. In view of the foregoing, it is intended that the present disclosure cover modifications and variations of this disclosure provided they fall within the scope of the following claims.

What is claimed is:

1. A cooling device for rack servers, comprising:
   an environmental temperature sensor, configured to sense an ambient temperature;
   a humidity sensor, configured to sense an ambient humidity;
   a coolant temperature sensor, disposed on an output conduit outputting a coolant and configured to sense an outlet-liquid temperature of the coolant outputted from the output conduit;
   an electronic valve, disposed on the output conduit; and
   a controller, connected with the environmental temperature sensor, the humidity sensor, the coolant temperature sensor, and the electronic valve, configured to compute a dew point temperature according to the ambient temperature and the ambient humidity, compute a temperature difference between the outlet-liquid temperature and the dew point temperature, and control an opening of the electronic valve according to the temperature difference to adjust a liquid flow of the coolant outputted, such that the outlet-liquid temperature dynamically changes according to the liquid flow,
   wherein the output conduit comprises a main conduit, a first branch conduit, and a second branch conduit, a first electronic valve is disposed on the first branch conduit, a second electronic valve is disposed on the second branch conduit, and the main conduit is respectively connected with the first branch conduit and the second branch conduit such that the coolant is outputted through either the first branch conduit or the second branch conduit, wherein the controller is configured to switch on the second electronic valve such that the coolant is outputted through the second branch conduit when determining that a failure of the first electronic valve occurs.

2. The cooling device of claim 1, wherein the controller is configured to decrease the opening of the electronic valve to a first value in order to decrease the liquid flow of the coolant outputted when the temperature difference is less than a first threshold, and keep decreasing the opening of the electronic valve to a second value in order to decrease the liquid flow of the coolant outputted when the temperature difference is less than a second threshold, wherein the second threshold is less than the first threshold and the second value is less than the first value.

3. The cooling device of claim 1, wherein the controller is configured to increase the opening of the electronic valve to a first value in order to increase the liquid flow of the coolant outputted when the temperature difference is not less than a first threshold, and increase the opening of the electronic valve to a second value in order to increase the liquid flow of the coolant outputted when the temperature difference is not less than a second threshold, wherein the second threshold is greater than the first threshold and the second value is greater than the first value.

4. The cooling device of claim 1, wherein the coolant temperature sensor is disposed on the main conduit.

5. A cooling method for rack servers, comprising:
   sensing an ambient temperature by an environmental temperature sensor;
   sensing an ambient humidity by a humidity sensor;
   sensing, by a coolant temperature sensor, an outlet-liquid temperature of a coolant outputted from an output conduit to a rack server;
   computing, by a controller, a dew point temperature according to the ambient temperature and the ambient humidity;
   computing, by the controller, a temperature difference between the outlet-liquid temperature and the dew point temperature and controlling an opening of an electronic valve disposed on the output conduit to adjust a liquid flow of the coolant outputted to the rack server according to the temperature difference, such that the outlet-liquid temperature dynamically changes according to the liquid flow;
   decreasing the opening of the electronic valve to a first value in order to decrease the liquid flow of the coolant when the temperature difference is less than a first threshold, and keeping decreasing the opening of the electronic valve to a second value in order to decrease the liquid flow of the coolant outputted when the temperature difference is less than a second threshold, wherein the second threshold is less than the first threshold and the second value is less than the first value;
   switching the opening of the electronic valve from a maximum opening level to half of the maximum opening level when the temperature difference decreases from greater than or equal to 5 degrees to between 2 degrees and 5 degrees; and
   switching the opening of the electronic valve from half of the maximum opening level to one-fifth of the maximum opening level when the temperature difference decreases from between 2 degrees and 5 degrees to less than 2 degrees.

6. The cooling method of claim 5, further comprising:
   increasing the opening of the electronic valve to a third value in order to increase the liquid flow of the coolant outputted when the temperature difference is not less than a third threshold, and increasing the opening of the electronic valve to a fourth value in order to increase the liquid flow of the coolant outputted when the temperature difference is not less than a fourth threshold, wherein the fourth threshold is greater than the third threshold and the fourth value is greater than the third value.

7. The cooling method of claim 6, further comprising:
   switching the opening of the electronic valve from one-fifth of a maximum opening level to half of the maximum opening level when the temperature difference increases from less than 4 degrees to between 4 degrees and 7 degrees; and
   switching the opening of the electronic valve from half of the maximum opening level to the maximum opening level when the temperature difference increases from between 4 degrees and 7 degrees to greater than 7 degrees.

\* \* \* \* \*